US008974629B2

(12) United States Patent
Chevalier et al.

(10) Patent No.: US 8,974,629 B2
(45) Date of Patent: Mar. 10, 2015

(54) HIGH DENSITY PLASMA REACTOR

(75) Inventors: Eric Chevalier, Veyrier de Lac (FR); Philippe Guittienne, Lausanne (CH)

(73) Assignee: Helyssen SARL, Lausanne (CH)

( * ) Notice: Subject to any disclaimer, the term of this patent is extended or adjusted under 35 U.S.C. 154(b) by 2209 days.

(21) Appl. No.: 10/557,695

(22) PCT Filed: May 18, 2004

(86) PCT No.: PCT/CH2004/000300
§ 371 (c)(1), (2), (4) Date: Dec. 22, 2005

(87) PCT Pub. No.: WO2004/105078
PCT Pub. Date: Dec. 2, 2004

(65) Prior Publication Data

US 2007/0056515 A1 Mar. 15, 2007

(30) Foreign Application Priority Data

May 22, 2003 (EP) .................................... 03405360

(51) Int. Cl.

| | |
|---|---|
| ***C23C 16/00*** | (2006.01) |
| ***H01L 21/306*** | (2006.01) |
| ***H05H 1/46*** | (2006.01) |

(52) U.S. Cl.
CPC ...................................... *H05H 1/46* (2013.01)
USPC .............. 156/345.48; 118/723 I; 118/723 AN

(58) Field of Classification Search
CPC H01J 37/321; H01J 37/3211; H01J 37/32119
USPC ....... 118/723 I, 723 IR, 723 AN; 156/345.48, 156/345.49; 315/111.51
See application file for complete search history.

(56) References Cited

U.S. PATENT DOCUMENTS 4,915,978 A 4/1990 von Campe et al.
4,990,229 A * 2/1991 Campbell et al. ........ 204/298.06
(Continued)

FOREIGN PATENT DOCUMENTS

EP 0 403 418 A2 12/1990
EP 0 403 418 A3 12/1990
(Continued)

OTHER PUBLICATIONS

Definition of the term "interconnect", Merriam-Webster Dictionary, Online edition, http://www.merriam-webster.com/dictionary/interconnecting.*
(Continued)

*Primary Examiner* — Luz Alejandro Mulero
(74) *Attorney, Agent, or Firm* — Nixon & Vanderhye PC

(57) ABSTRACT

A high density RF plasma source uses a special antenna configuration to launch waves at frequencies such as 13.56 MHz. The tunability of this antenna allows one to adapt actively the coupling of the RF energy into an evolutive plasma as found in plasma processing in semiconductor manufacturing. The plasma source can be used for plasma etching, deposition, sputtering systems, space propulsion, plasma based sterilization, and plasma abatement systems. Also, the plasma source can be used with one or several process chambers, which comprise an array of magnets and RF coils too. These elements can be used for plasma confinement or active plasma control (plasma rotation) thanks to a feedback control approach, and for in situ NMR monitoring or analysis such as moisture monitoring inside a process chamber, before or after the plasma process, or for in situ NMR inspection of wafers or others work pieces.

26 Claims, 6 Drawing Sheets

(56) References Cited

U.S. PATENT DOCUMENTS

| | | | | |
|---|---|---|---|---|
| 5,146,137 | A | 9/1992 | Gesche et al. | |
| 5,180,949 | A * | 1/1993 | Durr | 315/111.51 |
| 5,690,781 | A * | 11/1997 | Yoshida et al. | 156/345.48 |
| 5,728,253 | A * | 3/1998 | Saito et al. | 156/345.25 |
| 5,811,022 | A * | 9/1998 | Savas et al. | 216/68 |
| 5,888,413 | A * | 3/1999 | Okumura et al. | 216/68 |
| 6,024,826 | A * | 2/2000 | Collins et al. | 156/345.37 |
| 6,096,232 | A * | 8/2000 | Hashimoto | 216/60 |
| 6,164,241 | A | 12/2000 | Chen et al. | |
| 6,441,555 | B1 * | 8/2002 | Howald et al. | 315/111.51 |
| 6,495,963 | B1 * | 12/2002 | Bennett | 315/111.51 |
| 2002/0007794 | A1 | 1/2002 | Byun et al. | |
| 2002/0189763 | A1 * | 12/2002 | Kwon et al. | 156/345.48 |

FOREIGN PATENT DOCUMENTS

| | | |
|---|---|---|
| JP | 10-70107 | 3/1998 |
| WO | WO 96/19910 | 6/1996 |
| WO | WO00/36632 A3 | 6/2000 |

OTHER PUBLICATIONS

International Search Report (PCT/CH2004/000300).

* cited by examiner

HIGH DENSITY PLASMA REACTOR

This application is the US national phase of international application PCT/CH2004/000300 filed 18 May 2004 which designated the U.S. and claims benefit of EP 03405360.3, dated 22 May 2003, the entire content of which is hereby incorporated by reference.

FIELD OF THE INVENTION

The present invention relates to a method and apparatus for enhancing plasma source and associated processes.

BACKGROUND OF THE INVENTION

Helicon wave discharges are known to efficiently produce high-density plasma, and have been exploited as a high density plasma tool for semiconductor processing (etching, deposition, sputtering . . . ) [Lieberman M. A., Lichtenberg A. J., Principles of Plasma Discharges and Materials Processing, J. Wiley & Sons, 1994, New York.], space propulsion and basic plasma experiments. The plasma is usually generated in a cylindrical vacuum vessel in a longitudinal homogeneous magnetic field at 100-300 G or higher. The electromagnetic energy is transferred to the plasma source with frequencies between 1 and 50 MHz, usually with 13.56 MHz for processing plasmas. Helicon waves are generated in the plasma column by specially-shaped antennas.

The most common antenna used to excite helicon waves is the Nagoya Type III antenna [Okamura S, et al. 1986 Nucl. Fusion 26 1491], a modification of which is the double-saddle coil of Boswell [Boswell R. W. 1984, Plasma Phys. Control. Fusion, 26 1147]. Helical antennae were first used by Shoji et al., and have been adapted such that single-loop antennae [Sakawa Y., Koshikawa N, Shoji T, 1996 Appl. Phys. Lett. 69 1695; Carter C. and Khachan J., 1999 Plasma Sources Sci. Technol. 8 432], double loop antennae [Tynan G. R. et al. 1997 J. Vac. Sci. Technol. A 15 2885; Degeling A. W., Jung C. O., Boswell R. W., Ellingboe A. R., 1996 Phys. Plasmas 3 2788], solenoid antennae [Kim J. H., Yun S. M., and Chang H. Y. 1996 Phys. Lett. A 221 94], and bifilar rotating-field antennae [Miljak D. G. and Chen F. F. 1998 Plasma Sources Sci. Technol. 7 61].

The damping of this wave can be explained by collisional theory [Chen F. F., Sudit I. D. and Light M., 1996 Plasma Sources Sci. Technol. 5 173], but collisionless (Landau) damping of helicon waves and the helicon wave transfer through the excitation of another wave at the boundary of the chamber called Trivelpiece-Gould mode has also been discussed [Chen F. F. Physical mechanisms in industrial RF plasma Sources, LTP-104, 2001, UCLA]. The type of discharge achieves electron densities up to $10_{12}$-$10_{13}$ cm$^{-3}$ in the 0.1 Pa pressure range.

The main features which define the right antenna structure to excite Helicon waves for generation of plasmas are:

- Frequency of Excitation: It should be such that the waves satisfies: $\omega ci<\omega<\omega c$ ($\omega ci$=ion cyclotron frequency, $\omega c$=electron cyclotron frequency). Industrial standard frequency such as 13.56 MHz are usually used in semiconductor processing.
- Wave mode: the mode structure of the wave electromagnetic fields generated so that an antenna arrangement can best be designed to efficiently couple the RF power into wave excitation. The two lowest modes are m=0 and m=1 modes. The best way to excite the mode m=0 would be with two loops separated in distance by a half-wavelength. For the mode m=1 there is a natural helical pitch to the electric and magnetic field vectors as the wave propagates along a principal axis. Given the state of the art, the current way to excite this mode is with a helical shaped antenna.
- Efficiency of coupling RF power to plasma: the efficiency of the plasma production depends on the coupling of RF energy into the plasma. An important mechanism for damping of the RF energy is Landau damping. The phase velocity of the helicon wave is given by $\omega/k_z$ where $k_z$, is given by the dispersion relation and depends on the plasma density and magnetic field strength. Ideally, the phase velocity of the wave should be near the maximum of the ionisation potential of the gas we wish to ionise. The higher the value of $k_z$, the higher the density. But if $k_z$ is too high then the energy of the electrons may fall below the ionisation potential. It is therefore important to control $k_z$ in order to be able to increase the density and control the electron temperature.

It is known to generate Helicon waves with an apparatus comprises four pairs of electrodes (U.S. Pat. No. 5,146,137, K-H Kretschmer & al., 1992-09-08). A first pair of the electrodes is connected to a first voltage. A second pair of the electrodes is connected to a second voltage. The first voltage is 90.degree. phase shifted relative to the second voltage. The first and second pairs of electrodes are mounted on a first region of the container. The third pair of the electrodes and the fourth pair of the electrodes are then mounted on a second region of the container a distance from the first region of the container. The third and fourth pair of electrodes are connected to phase shifted voltages, in a manner similar to the first and second pair of electrodes. In an alternate aspect, the apparatus generate a plasma inside a container using circularly polarized waves by coupling electromagnetic energy into the plasma through the container wall from the outside: The apparatus comprises four coils. A first coil is connected to a first voltage. A second coil is connected to a second voltage. The first voltage is 90.degree. phase shifted relative to the second voltage. The third and fourth coil are connected to phase shifted voltages, in a manner similar to the first and second coil. In yet a third form, the apparatus comprises four pairs of coils. A first pair of the coils is connected to a first voltage. A second pair of the coils is connected to a second voltage. The first voltage is 90.degree. phase shifted relative to the second voltage. The first and second pairs of coils are mounted on a first region of the container. The third pair of the coils and the fourth pair of the coils are then mounted on a second region of the container a distance from the first region of the container. The third and fourth pair of coils are connected to phase shifted voltages, in a manner similar to the first and second pairs of coils.

The major differences between the previous apparatus and our invention is that our antenna consists in one coil (conductive loop and axial segments are connected) including capacitive elements whereas the apparatus consists in four independent electrodes or coils without connected capacitive elements. Moreover, our invention is a resonant antenna where there is a sinusoidal current distribution in function of the azimutal angle which is not the case for the apparatus.

The conjunction of the plasma source with a process chamber where workpieces are located to either deposit, or etch films or to sputter deposit films to the workpieces is known. This processing system comprises, in particular, external magnet components and RF coils in order to be used as an in situ Nuclear Magnetic Resonance. The use of nuclear magnetic resonance (NMR) for physical, chemical and biological studies is very well developed and highly successful [P. J.

Hore, Nuclear Magnetic Resonance, Oxford University Press, Oxford, UK, 1995]. The application of NMR for Plasma diagnostic techniques has recently been undertaken [Zweben S. J. et al., 2003, Rev. Sci. Inst., 74, 1460] for Tokamak experiments. The application of NMR in low pressure and/or temperature plasma processes in particular for moisture monitoring, contamination monitoring, chamber characterizations, in order to reduce the troubleshooting time of the equipment and improve the quality of manufactured devices, is still quite innovative.

SUMMARY OF THE INVENTION

In accordance with the invention, there is provided a plasma source apparatus as defined in claim 1.

The invention uses one or multiple plasma source in conjunction with one or multiple process chamber to provide a high and uniform density over a large area inside the process chamber.

In another embodiment, the capacitive elements and/or moveable axial conductive elements of the antenna are tuned such that to increase the coupling between the RF energy and the plasma, defining an active antenna.

In another embodiment, the main components in the plasma source or in a process chamber can be used as an in situ monitoring of the environment inside the chamber or an in situ inspection of workpieces (such as wafer as part of semiconductor processes) based on the NMR principle.

DEFINITIONS

Figure 1:
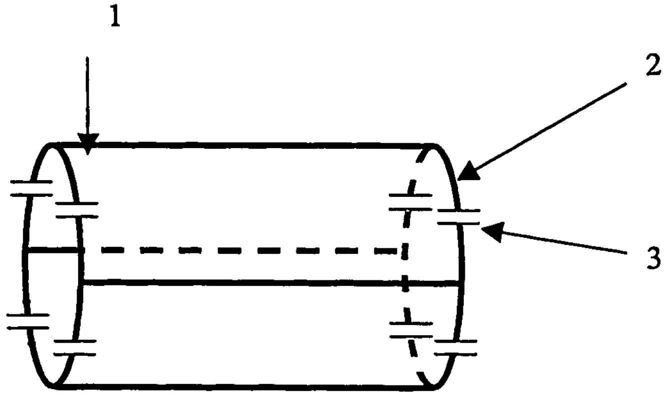
FIG. 1 is a schematic view of an antenna arrangement according to the present invention
Figure 2:
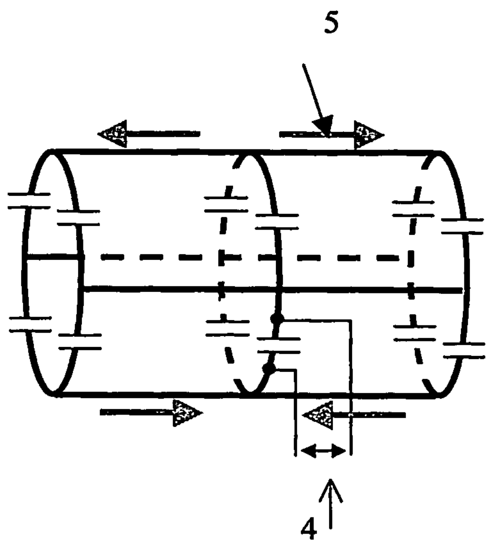
FIG. 2 is a schematic view of an antenna configuration in an another embodiment

Fluid: the term comprises gas, diphasic liquids, or supercritical gas

A Conductive loop: a conductive element which can be closed or opened, and which the shape can be circular, or elliptic, or with right angles.

A radio frequency generator: A device supplying continuous or pulsed RF power at one or several frequencies.

A process chamber: a chamber where happen plasma processings such as etching, deposition, sputtering, ion generation, sterilization or a chamber where inside one or several workpieces (wafer(s)) is placed for transfer, conditioning, stock processings.

DETAILED DESCRIPTION

As can been seen on FIGS. 1, 2, 4, 6 and 7, the first principle structure of the present invention is the antenna configuration: RF current is made to flow through at least a pair of conductive loops (with any topology) 2 and axial conductive elements 1. In such a way that the current is passing in the case of the FIG. 2 configuration according to 5. The RF voltage is applied from a RF power supply 4.

One feature of the coil concerns the excitation. Excitation of the RF coil at a single excitation point results in a linearly polarized magnetic field B. Quadrature excitation can be achieved in a straight forward manner using the coil described in one possible configuration (see FIG. 1). This can be accomplished by exciting the coil at two input capacitors 3 located at right angles relative to one another along the circumference of one conductive loop elements 2. Additionally, to achieve the desired circular polarization, the RF sources used to excite the coil at two points must be electrically 90 degree out of phase relative to one another. In this manner, the two modes with approximately uniform transverse fields, as described above are excited.

A further feature of the antenna can be realized by utilizing multiple RF amplifiers to energize the antenna. Each amplifier is attached to different input capacitor, and the signal through each amplifier is phased correctly to produce the desired RF excitation. In this way, the power requirement from each amplifier is reduced as compared to the requirement for driving the antenna with one or two amplifiers.

The antenna can be made with a solid round wire, in copper for example, or with a conductor consisting of a number of separately insulated strands that are twisted or braided together. Since each strand tends to take all possible positions in the cross section of the entire conductor, this design equalizes the flux linkages—and reactances—of the individual strands causing the current to spread uniformly throughout the conductor. The primary benefit is the reduction of AC losses. An example of such construction are known as Litz wire.

It should be recognized that the multiple amplifier configurations described above are merely exemplary and many other combinations utilizing four or more amplifiers are possible.

Figure 3:
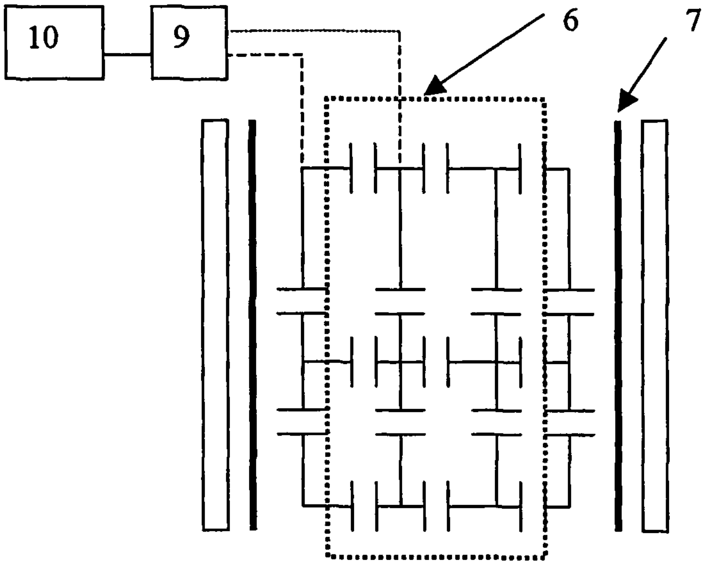
FIG. 3 is a schematic view of the basic configuration of a plasma source
Figure 4:
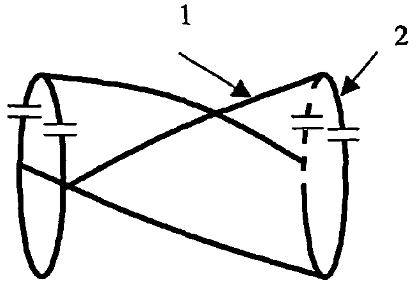
FIG. 4 is a schematic view of an antenna configuration where axial conductive elements are twisted

A basic configuration of the plasma source is shown on the FIG. 3. with a Pyrex plasma generation chamber 6 surrounded by magnet field generators 8 placed on a pipe typically in PVC. The RF power 10 gives energy to the antenna through a matching network 9.

A major advantage of this antenna is that the current distribution appears to be zero for every mode $m \neq \pm 1$. All the antenna power will be concentrated in those two modes. Experimentally the $m=1$ mode appears to be the more efficient for plasma heating with helicon waves. Another advantage is the high homogeneity of the plasma inside the chamber which can decrease significantly the damage on integrated circuits, increasing the yield of the manufacturing.

Especially in processing plasmas, the main features (density, electron temperature, ionic temperature, partial pressure species . . . ) are dependent of the process time due to the interactions not only with the workpieces but also with the, whole process chamber. That is why the possibility to adjust the coupling between the RF energy and the evolutive plasma allows high improvements of the process and the uptime of the equipment. We propose in another embodiment according the present invention to define an Active Antenna: where at least one capacitor is tunable and/or at least one conductive loop position is moveable, and/or at least one conductive loop rotation (→twisted antenna) leading to a non zero angle between the axial conductive element's connexion on the first upper loop and the axial conductive element's connexion on the first lower loop, is moveable. A further configuration involves the feedback control of the active antenna according to sensors used as diagnostic techniques (magnetic probe, optical probe, Langmuir probe, Hall probe . . . ).

In another embodiment according to the present invention, the magnets can deliver magnetic amplitudes in function of time and/or space to perform peristaltic magnetic actions on the plasma defining in the plasma generation chamber successive areas of high and low density. This pattern can generate multiple double layers which are structures constituted by two adjacent sheaths of charge with opposite signs connecting different values of plasma potential through a monotic spatial potential profile.

In another embodiment according to the present invention, in order to enhance the performances of the plasma source it is possible to add close to the source a complementary source as Electron cyclotron resonance, ion cyclotron resonance or Electron Bernstein wave.

In another embodiment according to the present invention where frequency tuning is accomplished by mechanically moving a concentric RF shield about the longitudinal axis of an RF coil. Moving the shield about the RF coil effectively changes the mutual inductance of the system, providing a mechanism for adjusting the resonant frequency.

Figure 5:
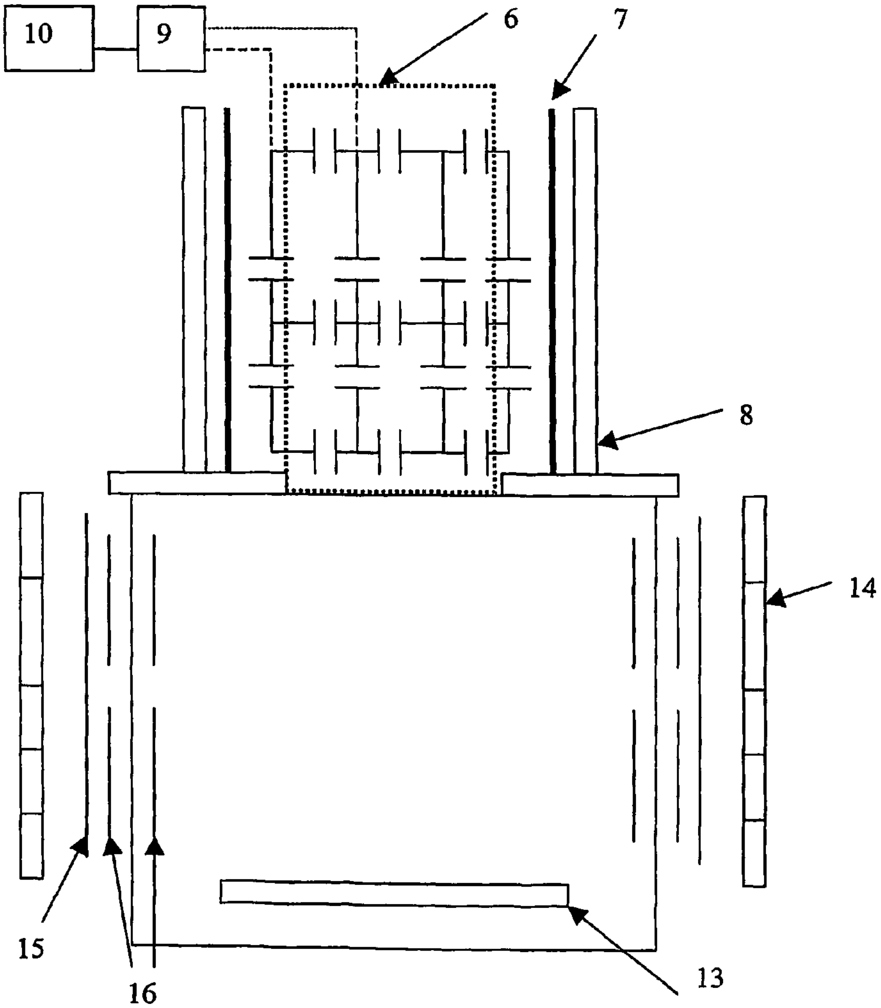
FIG. 5 is a schematic view of a configuration of a plasma reactor comprising antennae inside and outside the reactor, and an array of elementary magnets.
Figure 6:
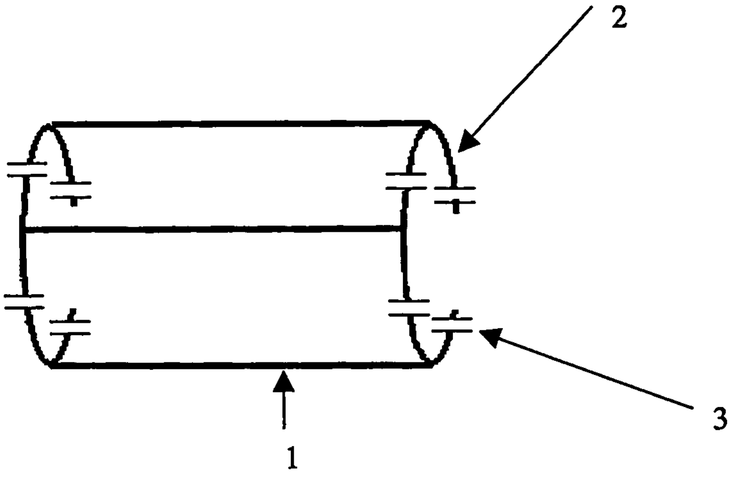
FIG. 6 is a schematic view of an antenna arrangement according to the present invention, with opened conductive loops
Figure 7:
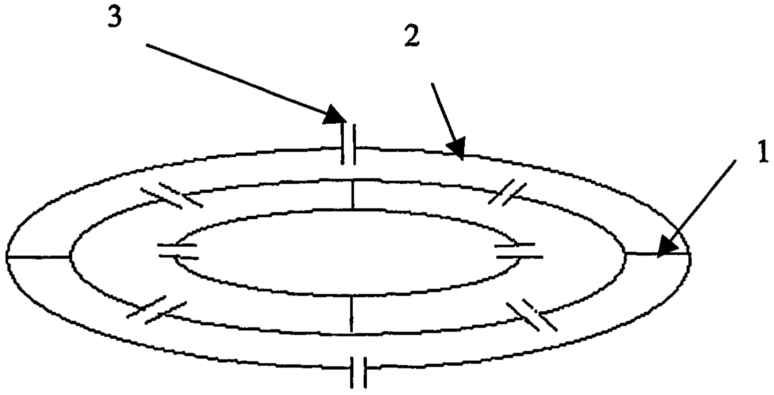
FIG. 7 is a schematic view of an antenna configuration in an another embodiment
Figure 8:
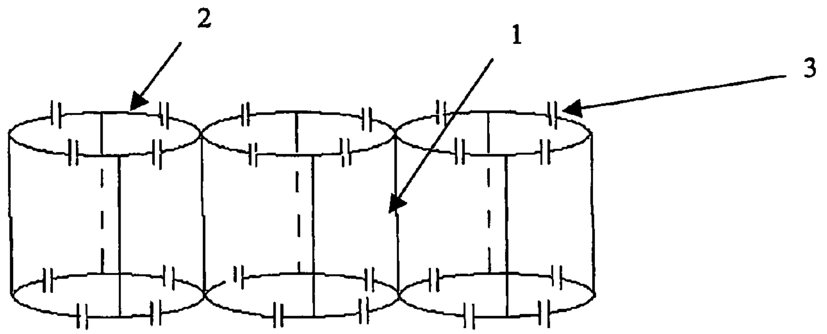
FIG. 8 is a schematic view of a network of antennas according to the present invention

In another embodiment according to the present invention the plasma source is in conjunction with a process chamber (see FIG. 5) comprising an array of magnets 14, an array of RF coils outside the chamber walls 15, and an array of RF coils inside the chamber 16. The RF coils can be design as the one of the plasma source, that is to say with a plurality of capacitors. One part of the coils are used as feedback coils and the other part as sensor coils. It is possible to control the plasma stability by acquiring the coil sensor signal and, after treatment, to apply convenient current in order to improve the plasma behaviour. The sensors coils can be replaced by other type of sensors (optical probe, Hall probe, . . . ).

In another embodiment according to the present invention, series of electrodes are added inside the process chamber on which typically an oscillating voltage. This action allows to confine the plasma and/or particles. The quadrupole electric fields of this trap exert radial forces on the charged particles that are analogous to radial forces that a periodic focusing quadrupole magnetic field exerts on charged particles.

In another embodiment according the present invention, we use the components of the process chamber (array of magnets and arrays of RF coils) to proceed to an in situ monitoring by Nuclear Magnetic Resonance. Indeed, we can apply a transient pulse of RF field through one or more coils. After tuning off the pulse(s), the emitted energy is measured as an alternating voltage induced in the same coil(s). The amplitude of this NMR signal is proportional to number of resonant spins in the observed object (Chamber wall, workpieces . . . ). But the absorbed excess energy is also dissipated due to interactions between the spins and their atomic and molecular environment as well as due to spin-spin interactions. These interactions are modulated in time by molecular motions giving rise to two relaxation processes. It leads for example that chemically combined water can be distinguished from water, which is physically bound to a solid surface and water, which is in the bulk liquid state. It is possible to improve the monitoring by a magnetic field strength, which defines a gradient in a specific direction.

These NMR monitoring allow to improve significantly the process (before and after the plasma process, or after a preventive maintenance, it is possible to control the quality of the atmosphere, in particular the water rate), to optimise the uptime of the equipment and then the yield of the manufactured devices.

In another embodiment according to the present invention, the plasma source is coupled with an optical resonator to carry out a gas laser system by RF plasma. This device comprises a gas discharge tube made of quartz and sealed with two flat semi-transparent mirrors defining an optical resonator, the antenna of the present invention used in the presence of magnets to excite RF discharge. One of the mirrors can be mounted on a piezoelectric transducer. The mirrors are aligned to provide multiple reflections of lightwaves.

In another embodiment according to the present invention, the plasma source is couple with an apparatus generating acoustic cavitation bubbles, which act as nuclei for the ignition and maintenance of the plasma. Because the plasma is formed in a liquid environment, it is possible to obtain much higher film deposition rates or etching rates (it depends on chemical species involved) at much lower plasma temperatures than ever before. In addition this process can be carried out at normal temperatures and pressures. Previous combinations of ultrasonic waves and on one hand, microwave irradiation was performed by S. Nomura and H. Toyota, 2003, Applied Physics Letters, 83, 4503, and one the other hand, glow discharge engineered by Dow Corning Plasma. Here we propose to combine the ultrasonic waves with a RF plasma type.

The main applications where the present invention is relevant are plasma processing (semiconductor manufacturing, Microtechnologies, nanotechnologies), Plasma welding, plasma-based sterilization, Plasma cutting, space propulsion, plasma abatment systems, academic research . . . .

Although the invention has been described and illustrated with particularity, it is intended to be illustrative of preferred embodiments. It is understood that the disclosure has been made by way of example only. Numerous changes in the combination and arrangements of the parts, steps and features can be made by those skilled in the art without departing from the spirit and scope of the invention, as hereinafter claimed.

The invention claimed is:

1. A plasma source apparatus for plasma generation by helicon waves, comprising:

a. an antenna, b. a plasma generation chamber in the proximity of the antenna, c. a fluid injector for introducing at least one fluid into the plasma generation chamber, d. a radio frequency generator with continuous or pulsed RF power supply, wherein:

the source apparatus comprises magnetic field generators arranged around the antenna, said antenna comprises at least two closed conductive loop elements surrounding and spaced along a common longitudinal axis and at least a pair of axial conductive elements electrically interconnecting said conductive loop elements, each of said conductive loop elements including at least one capacitor, and wherein the antenna is structured as a resonant antenna that generates plasma by helicon waves.

2. The plasma source apparatus according to claim 1 wherein only said conductive loop elements include at least one capacitor.

3. The plasma source apparatus according to claim 1 wherein said conductive loop elements and said axial conductive elements include at least one capacitor.

4. The plasma source apparatus according to claim 1, wherein each axial conductive element interconnects said conductive loop elements.

5. The plasma source apparatus according to claim 1 comprising antenna cooling means such as a chiller, a heat pipe, a Cryo-cooler or a Peltier device.

6. The plasma source apparatus according to claim 1, further comprising thermal control means for the plasma generation chamber in order to avoid thermal shock between an inside and an outside of the plasma generation chamber during plasma ignition.

7. The plasma source apparatus according to claim 1, further comprising a matching network interconnecting the radio frequency generator and the antenna, in such a way as to promote an optimal transfer of radio frequency energy from the radio frequency generator to the antenna.

8. The plasma source apparatus according to claim 1, further comprising a fixed or a moveable shield, enclosing but disconnected from the antenna which is adapted to define or to adjust in real time an optimal electromagnetic coupling between the antenna and the plasma.

9. The plasma source apparatus according to claim 8, wherein the shield is adapted to define or to adjust in real time the optimal electromagnetic coupling between the antenna and the plasma.

10. The plasma source apparatus according to claim 8, wherein the shield is a concentric shield about a longitudinal axis of the antenna, and wherein a frequency tuning is accomplished by mechanically moving the concentric shield along said axis.

11. The plasma source apparatus according to claim 1, wherein at least one of said capacitors is tunable.

12. The plasma source apparatus according to claim 1, wherein at least one of said conductive loop elements is movable.

13. The plasma source apparatus according to claim 1, further coupled with an optical resonator comprising at least two mirrors placed at the limits of the plasma generation chamber, and wherein the mirrors are aligned to provide multiple reflections of lightwaves.

14. The plasma source apparatus according to claim 1, further coupled with an apparatus generating cavitation bubbles by ultrasonic waves, the plasma generation chamber containing a liquid from where the bubbles are generated, the apparatus being adapted to induce RF energy into an interior of the cavitation bubbles for ignition and maintenance of the plasma.

15. The plasma source apparatus according to claim 1, further coupled with a complementary plasma source as Electron cyclotron resonance source or Ion cyclotron resonance source.

16. The plasma source apparatus according to claim 1, further coupled with a complementary antenna inside or outside the plasma generation chamber.

17. The plasma source apparatus according to claim 1, wherein the antenna is also adapted as a receiving system to perform Nuclear Magnetic Resonance (NMR) Monitoring or analysis of fluid or a workpiece implemented inside the plasma generation chamber.

18. The plasma source apparatus according to claim 1, wherein each of said axial conductive elements and/or said conductive loop elements are made with volume conductive wire, braids wire, Litz wire, or hollow wire.

19. The plasma source apparatus according to claim 1, further comprising a network of antennas wherein adjacent antennas have at least one common axial conductive element.

20. The plasma source apparatus according to claim 1, wherein the apparatus is connected to one or a plurality of process chambers.

21. The plasma source apparatus according to claim 20 comprising a plurality of magnets, the magnets being arranged in a circumferential manner proximate to the process chamber, to perform NMR inspection of the process chamber and/or the workpiece inside.

22. The plasma source apparatus according to claim 20 comprising a plurality of electrodes defining a Paul trap type or a Penning trap type on which an oscillating voltage is applied.

23. The plurality of plasma source apparatus according to claim 1, wherein a plasma source is operatively connected to at least one process chamber.

24. The plasma source apparatus according to claim 23, further comprising a plurality of RF coils, the RF coils being arranged in a circumferential manner proximate to the process chamber.

25. The plasma source apparatus according to claim 24 wherein at least one of the RF coils comprises a capacitor.

26. The plasma source apparatus according to claim 1, wherein the apparatus is adapted such that the antenna has a sinusoidal current distribution in function of an azimuthal angle.

* * * * *